United States Patent

Harris et al.

[11] Patent Number: 5,773,849
[45] Date of Patent: Jun. 30, 1998

[54] FIELD OF THE INVENTION

[75] Inventors: Christopher Harris, Sollentuna; Mietek Bakowski, Skultuna; Ulf Gustafsson, Linköping; Mats Andersson, Stenungsund, all of Sweden

[73] Assignee: ABB Research Ltd., Zurich, Switzerland

[21] Appl. No.: 636,940

[22] Filed: Apr. 24, 1996

[51] Int. Cl.⁶ .............................................. H01L 31/0312
[52] U.S. Cl. ........................... 257/77; 257/329; 257/330; 257/342
[58] Field of Search ................................... 257/139, 212, 257/77, 107, 256, 288, 132, 133, 329, 330, 342

[56] References Cited

U.S. PATENT DOCUMENTS

| | | | |
|---|---|---|---|
| 3,823,352 | 7/1974 | Pruniaux et al. | 357/23 |
| 5,014,102 | 5/1991 | Adler | 357/38 |
| 5,032,888 | 7/1991 | Seki | 357/37 |
| 5,312,782 | 5/1994 | Miyazawa | 437/235 |
| 5,323,040 | 6/1994 | Baliga | 257/332 |
| 5,396,085 | 3/1995 | Baliga | 257/77 |
| 5,451,797 | 9/1995 | Davis et al. | 257/77 |
| 5,489,787 | 2/1996 | Amaratunga et al. | 257/137 |
| 5,614,749 | 3/1997 | Ueno | 257/330 |

*Primary Examiner*—Sara W. Crane
*Assistant Examiner*—Douglas A. Wille
*Attorney, Agent, or Firm*—Pollock, Vande Sande & Priddy

[57] ABSTRACT

A field controlled semiconductor device of SiC has a drain, a highly doped substrate layer on top of the drain and a low doped n-type drift layer on top of the substrate layer. A p-type base layer is located on the drift layer and a vertical trench extends through the base layer. In the trench an n-type channel region extends vertically along a wall of the trench and connects a source region layer to the drift layer. A gate electrode is arranged in the trench to be on the opposite side of the channel region with respect to the base layer.

14 Claims, 1 Drawing Sheet

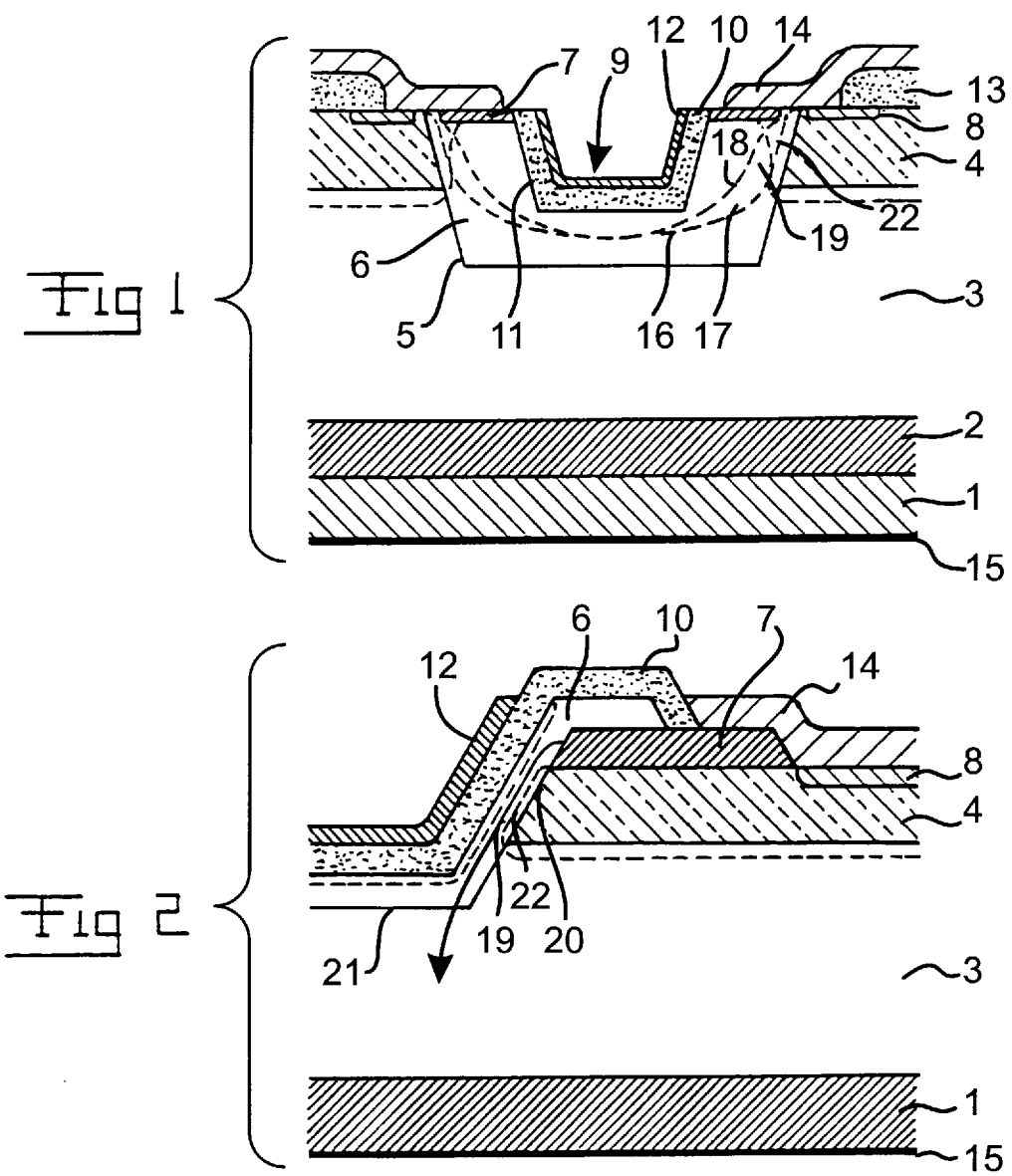

FIELD OF THE INVENTION

TECHNICAL FIELD OF THE INVENTION AND PRIOR ART

The present invention relates to a field controlled semiconductor device of SiC comprising superimposed in the order mentioned at least a drain, a highly doped substrate layer and a low doped n-type drift layer. The device further comprises a highly doped n-type source region layer and a source connected thereto, a vertical trench formed in the drift layer, a low doped n-type channel region layer extending vertically along a wall of the trench and connecting the source region layer to the drift layer and through which a current flows when the device is in an on-state. A gate electrode is arranged in the trench at least along the wall and to, upon applying a voltage thereto, influence the charge carrier distribution of the channel region layer and by that the conductivity thereof. This invention also relates to a method for producing such a semiconductor device.

All types of field controlled semiconductor devices are included, such as for example field controlled transistors and field controlled thyristors.

Such SiC semiconductor devices may especially be used as switching devices in power applications since it is possible to turn them on and off very rapidly. Such SiC devices are particularly well suited for high power applications, since such applications make it possible to benefit from the superior properties of SiC in comparison with especially Si, namely the capability of SiC to function well under extreme conditions. SiC has a high thermal stability due to a large bandgap energy, such that devices fabricated from this material are able to operate at high temperatures, namely up to 1000K. Furthermore, SiC has a high thermal conductivity, so that SiC devices may be arranged at a high density. SiC also has a more than 5 times higher breakdown field than Si, so that it is well suited as a material in high power devices operating under conditions where high voltages may occur in the blocking state of the device.

Such field controlled semiconductor devices may be divided into two main groups, namely so called normally-off devices and normally-on devices, which means that the channel region layer have no conducting channel allowing an electron transport from the source region layer to the drift layer when the gate electrode is laid on zero potential and that such a conducting channel is there when the gate electrode is laid on zero potential, respectively. Normally-off devices of more interest and have more applications, since no voltage has to be applied to the gate electrode for cutting the electron transport of the device off, but the present invention covers both types of devices.

A disadvantage of a prior art device is that the conducting channel is created at the interface between the channel region layer and an insulating layer located in the trench between the gate electrode and the channel region layer. The trap density at such a surface, especially an etched surface, is high, i.e. the on-state resistance of such a device will be high. This problem is even more important when an insulating layer is present between the gate electrode and the channel region layer, since the insulating layer may be charged due to charge injection from accelerated charge in the channel created at the interface between the insulating layer and the channel region layer. Such injection will typically result in the formation of acceptor-like traps, which progressively destroy the quality of the insulating layer. For a high power device such degradation and instability mechanisms are of particular concern due to the typical size of fields present in such devices.

A field controlled semiconductor device of the type defined in the introduction is known through the U.S. Pat. No. 5,323,040, and this device has vertical channel regions, which are laterally restricted on both sides by trenches, each receiving a gate electrode. A disadvantage of this known device is that there is a trench with a gate electrode on each side of the channel region layer, and the photolitographic process for producing the trenches with a small trench spacing has to be very fine. Thus, it is thereby very difficult to carry out and to produce a normally-off device. For this reason the thickness of the channel region layer has to be only a couple of microns for a device that is off under zero potential.

SUMMARY OF THE INVENTION

The object of the present invention is to provide a SiC field controlled semiconductor a SiC field of the type defined in the introduction, through which the disadvantage mentioned above of the prior art device is reduced to a large extent, i.e. a device having a low on-state resistance and which may be produced without any problem by processing techniques suitable for SiC.

This object is obtained, in accordance with the invention providing such a field controlled semiconductor device which further comprises a p-type base layer arranged laterally next to the channel region layer at the opposite side thereof with respect to the gate electrode for forming a vertical conducting channel in the channel region at a distance from the trench wall.

Thanks to the provision of said base layer the on-state resistance will be considerably reduced with respect to the prior art devices discussed above, since the channel mobility will equal bulk mobility due to the channel conduction being independent of the surface conditions. Furthermore, it will be easy to produce a thin channel region layer, since no etching for obtaining a trench spacing in the order of a couple of microns is necessary because of the presence of the base layer at one side of the channel region layer. This means that it will be much easier to produce a normally-off device. The presence of the base layer, which helps to deplete the channel region layer, will make it even easier to produce a normally-off device. The p-type base layer will also act as a voltage blocking layer of the device.

According to a preferred embodiment of the invention the p-type base layer is highly doped at least in the region close to the channel region layer. Such a high doping of the base layer will make it easier to deplete the channel region layer at a zero potential applied on the gate electrode, so that the thickness of the channel region layer may be made larger and a normally-off device is still obtained.

According to another preferred embodiment of the present invention the gate electrode is insulated with respect to the channel region layer by an interposed insulated layer. This is a preferred characteristic, since the gate electrode will then not take any current itself.

According to another preferred embodiment of the invention the thickness in the lateral direction between the trench and the base layer and the doping concentration of the low doped channel region layer are co-ordinated with the doping concentration of the base layer and the choice of gate so as to form a p-type depletion region layer in the channel region layer blocking the passage of electrons from the source region layer to the drift layer when a zero potential is applied to the gate electrode for making the device a normally-off device. The advantages of such a device are evident for those skilled in the art.

According to another preferred embodiment of the invention the device comprises an additional highly doped p-type layer arranged laterally with respect to the low doped n-type channel region layer at the opposite the thereof with respect to said trench and being in contact with the source. Such a highly doped p-type layer is particularly advantageous when the device is a thyristor, since the electron current flowing from the source region layer into the drift layer will create an injection of holes into the drift layer from the substrate layer, and these holes may be collected by the highly doped p-type layer while reducing the latchup problem of such a device.

According to another preferred embodiment of the invention the channel region layer has a lower doping concentration than the drift layer. Such a low doping concentration of the channel region layer facilitates the depletion thereof, so that the conductivity of the channel region layer can be better controlled.

A further object of the invention is to provide a method for producing a field controlled semiconductor device of SiC being either a transistor or an thyristor, for which the disadvantages of the prior art device of this type discussed above is considerably reduced.

Such a method comprises according to the invention the steps of:

1) epitaxially growing on top of each other the following semiconductor layers of SiC: a highly doped substrate layer being of n-type or of of p-type, for p-type there may be on top thereof one of a a highly doped n-type buffer layer or no such layer, a low doped n-type drift layer and a doped p-type base layer,
2) etching a groove extending through the base layer and into the drift layer,
3) epitaxially growing a low doped n-type channel region layer in the groove,
4) implanting n-type dopants into a surface layer of the channel region layer or epitaxially growing a n-type layer on top of the channel region layer, at a lateral distance from the base layer for forming a highly doped n-type source region layer,
5) etching a trench into the channel region layer leaving the source region layer at the upper corner of the trench,
6) applying a gate electrode in the trench at least along a trench wall extending along the channel region layer and a source on the source region layer.

By forming a low doped n-type channel region layer by epitaxially growing it in an etched groove, it will be possible to give the channel region layer an arbitrary thickness for adaption thereof to the requirements for the particular device. Such epitaxial growth of SiC is carried out at high temperatures, and the technique is most frequently the Chemical Vapor Deposition technique, which means that the surface resulting from the etching of the groove will be annealed during the so called regrowth step.

Another such method for producing a field controlled semiconductor device of SiC in the form of a MISFET comprises according to the invention the steps of:

1) epitaxially growing on top of each other the following semiconductor layers of SiC: a highly doped n-type substrate layer, a low doped n-type drift layer, a doped p-type base layer and a highly doped n-type source region layer,
2) etching a groove extending vertically through the channel region layer and the base layer and into the drift layer,
3) epitaxially growing an n-type channel region layer on at least a wall of the groove,
4) applying an insulating layer on the channel region layer and a gate electrode thereon extending substantially vertically along the wall.

The method is suitable for SiC and make it easy to produce a high quality MISFET of SiC.

Further advantages and preferred features of the invention will appear from the description and the other claims.

BRIEF DESCRIPTION OF THE DRAWING

With reference to the appended drawing, below follows a specific description of preferred embodiments of the invention cited as examples.

In the drawings:

FIG. 1 is a schematic cross-section view of a field controlled thyristor according to a first preferred embodiment of the invention and referring to which a preferred method for production thereof may be explained, and FIG. 2 is a schematic cross-section view of a MISFET according to a second preferred embodiment of the invention and through which a preferred method of producing a MISFET of SiC may be explained.

DETAILED DESCRIPTION OF PREFERRED EMBODIMENT

The field controlled thyristor shown in FIG. 1 is produced by carrying out a method according to a preferred embodiment of the invention, which will now be described. Conventional steps of making a semiconductor device having nothing to do with the invention, such as masking, demasking and so on, will for the sake of clarity not be described here. First of all the following semiconductor layers of SiC are epitaxially grown, preferably by Chemical Vapor Deposition, on top of each other: a highly doped p-type substrate layer 1, a highly doped n-type buffer layer 2, a low-doped n-type drift layer 3 and a doped p-type base layer 4. After that a MESA-etch is carried out for forming a groove 5 extending through the base layer and into the drift layer. A low doped n-type channel region layer 6, having preferably a considerably lower doping concentration than the drift layer, is then epitaxially grown in the groove. By such epitaxial growth the channel region layer may be given any desired thickness, such as 1–3 μm typically necessary for forming a normally-off device. After that n-type dopants are implanted into a surface layer of the channel region layer at a lateral distance from the base layer for forming a highly doped n-type source region layer 7, p-type dopants are implanted into a surface layer of the base layer at a lateral distance from the channel region layer to forming a highly doped p-type additional layer 8. A trench 9 is etched into the channel region layer leaving the source region layer at the upper corner of the trench. Then, an insulating layer 10 is applied in the trench at least along a trench wall 11 extending along the channel region layer, and a gate electrode 12, preferably of poly-crystalline silicon, is applied on the insulating layer. For a normally off device the gate is p-type doped so as to deplete the channel region layer. The gate electrode and the insulating layer cover in this case substantially the entire trench. Finally, a further passivating insulating layer 13 is applied while leaving a portion of the base layer and the channel region layer exposed, so that a source 14 may be applied on the source region layer 7 and the additional p-type layer 8. Two devices being in a mirror image relation are shown in FIG. 1. It is also possible to produce the source region layer 7 and the additional p-type layer 8 by epitaxial growth. When one or both of the layers 7 and 8 are produced by implantation, this is followed by an annealing step to make the implanted dopants electrically active. The buffer layer 2 is optional. Furthermore, a field controlled transistor may be produced in the same way, but the substrate layer will then be of n-type, and the buffer layer will not be present there. A drain contact 15 is brought in contact with the substrate layer.

The function of this field controlled thyristor will be as follows. This thyristor may be of normally-off normally-on type. We do now assume that it is of the normally-off type, which may be achieved by appropriately choosing the thickness and doping concentration of the channel region layer 6 and the doping concentration of the base layer 4 and of the gate. A lower doping concentration of the channel region layer and a higher doping concentration of the base layer 4 makes it possible to increase the thickness of the channel region layer and to still obtain a normally-off device. The depletion regions created by the gate and the base layer 4 will deplete the channel region layer 6 located next thereto according to the dashed line 22 and the gate electrode from the other side according to the dashed line 16 when a zero potential is applied to the gate electrode 12, so that a depleted layer 17 is formed in the channel region layer between the insulating layer 10 and the base layer 4 blocking an electron transport from the source region layer 7 to the drift layer 3. Application of a positive voltage to the gate electrode 12 will move the border 16 of the depleted layer 17 towards the insulating layer 10, and the extension 18 corresponds to a certain positive level of the voltage applied on the gate electrode. In this way a vertical conducting n-type channel 19 is created between the source region layer 7 and the drift layer 3. This conducting channel is located at a considerable distance from the trench wall 11 resulting in a channel mobility equal to bulk mobility due to the channel conduction being independent of the surface conditions, so that the on-state losses of such a device are very low with respect to the prior art field controlled thyristor discussed above. By the creation of the channel region layer by an epitaxial regrowth step, the channel region layer may be made just as thin as desired in each particular case without using any delicate photolitographic technique for obtaining a thin layer. Accordingly, a normally-off device may easily be produced. Such a device may of course also be made as a normally-on device, so that a voltage of an opposite sign to that according to above has to be applied to the gate electrode for eliminating the conducting channel 19. The highly doped p-type additional layer 8 will collect holes injected from the substrate layer into the drift layer as a result of the electron current flowing from the source region layer to the drain. This layer is not necessary for the case of a transistor but will be advantageous for obtaining a good contact between metal and p-base.

FIG. 2 illustrates a field controlled semiconductor device of SiC in the form of a MISFET, which may be produced by a method having the following steps: first the following semiconductor layers of SiC are epitaxially grown on top of each other: a highly doped n-type substrate layer 1, a low doped n-type drift layer 3, a doped p-type base layer 4 and a highly doped n-type source region layer 7. A MESA-etch is then carried out for forming a groove 5 extending vertically through the source region layer and the base layer and into the drift layer. A low doped n-type channel region layer 6 is then epitaxially grown on a wall 20 and a bottom 21 of the groove. Finally, an insulating layer 10, for example of $SiO_2$, is applied on the channel region layer and a gate electrode 12 thereon extending substantially vertically along the wall. By appropriately doping the base layer, the channel region layer 6 and choosing the gate and selecting the thickness of this layer, this device may be normally-off, i.e. a p-type depletion layer 17 will be formed in the channel region layer 6 and covering the entire cross-section thereof when a zero potential is applied to the gate electrode. If a voltage over a threshold voltage is applied to the gate electrode 12 a conducting vertical channel 19 will be created from the source region layer 7 to the drift layer 3 in the channel region layer 6 along and at a distance from the interface between channel region layer 6 and the base layer. As a bulk channel this channel will have a bulk carrier mobility rather than the degraded mobility of an inversion channel formed at the interface to the insulating layer, where there will be a considerably higher trap density. Thus, the on-state resistance of this device will be considerably lower than in a conventional MISFET.

MISFET is here defined as covering field effect transistors having an insulated gate, such as MOSFETs.

The low doped n-type channel region layer in the devices according to the different embodiments of the invention described above preferably has a doping concentration below or well below that of the drift layer, so that it will easily be depleted for controlling the conductivity thereof and making it possible to form a normally-off device. This doping concentration may be lowered to the order of $10^{14}$ $cm^{-3}$ or less.

The invention is of course not in any way restricted to the preferred embodiments described above, but many possible modifications thereof will be apparent to a person skilled in the art without departing from the basic idea of the invention.

It is emphasised that the thicknesses of different layers in the figures cannot be interpreted as limiting the scope of the invention, but any thickness relations are intended to be covered by the claims.

The dopants used may be of any material suitable as dopants for this application.

The number of layers mentioned in the claims is a minimum number, and it is within the scope of the invention to arrange further layers in the devices or dividing any layer into several layers by selective doping of different regions thereof. Especially the drift layer may be composed by sub-layers of different doping concentration, such as particularly low doping concentration close to the base layer.

Although it has been shown in the figures that the gate electrode is insulated, the invention is not restricted thereto, but it may also be diffused, i.e. be of bipolar type and then highly doped, which however is not that advantageous, since it will then take current.

"Substrate layer" is in this disclosure to be interpreted as the layer closest to the drain of the layers mentioned and it must not be a substrate layer in the strict sense of this word within this field, i.e. the layer from which the growth is started. The real substrate layer may be any of the layers and is mostly the thickest one, which may be the drift layer.

The method claims are to be interpreted as not restricted to a growth of the layers located on top of each other in the order they are mentioned, but any other order of growth of these layers is within the scope of the claims. For instance, the method may be started from the drift layer and the so called substrate layer and the drain may be grown at the very end of the method.

We claim:

1. A field controlled semiconductor device of SiC comprising superimposed thereon at least a drain, a highly doped substrate layer and a low doped n-type drift layer, said device further comprising a highly doped n-type source region layer and a source connected thereto, a vertical trench extending into said drift layer, a low doped n-type channel region layer extending vertically along a wall of said trench and connecting said source region layer to said drift layer and through which a current is intended to flow when the device is in an on-state, and a gate electrode arranged in said trench at least along said wall and to, upon applying a voltage thereto, influence the charge carrier distribution of said channel region layer and thus the conductivity thereof, and a p-type base layer arranged laterally next to said channel region layer at the opposite side thereof with respect to the gate electrode for forming a vertical conducting channel in said channel region layer at a distance from said trench wall.

2. A device according to claim 1, wherein said p-type base layer is highly doped at least in the region close to the channel region layer.

3. A device according to claim 1 wherein said gate electrode is insulated with respect to the channel region layer by an interposed insulating layer.

4. A device according to claim 1, wherein the thickness in the lateral direction between the trench and the base layer and the doping concentration of the low doped channel region layer are coordinated with the doping concentration of said base layer and the choice of the gate so as to form a p-type depletion region in the channel region layer totally blocking the passage of electrons from said source region layer to the drift layer when a zero potential is applied to the gate electrode to make a normally-off device.

5. A device according to claim 1, wherein said base layer is arranged on top of the drift layer.

6. A device according to claim 5, wherein said channel region layer extends downwardly beyond the interface between the base layer and the drift layer.

7. A device according to claim 1, wherein said source region layer is arranged on top of said base layer.

8. A device according to claim 3, wherein said device is a MISFET having a highly doped n-type substrate layer.

9. A device according to claim 1, wherein said device has a highly doped n-type substrate layer and is a transistor.

10. A device according to claim 1, wherein said device is a thyristor and has a highly doped p-type substrate layer and one of a) a highly doped n-type buffer layer and b) no such layer between said substrate layer and-the drift layer.

11. A device according to claim 9 wherein said device further comprises an additional highly doped p-type layer arranged laterally with respect to the low doped n-type channel region layer at the opposite side thereof with respect to said trench and in contact with the source.

12. A device according to claim 1, wherein said channel region layer has a lower doping concentration than said drift layer.

13. A device according to claim 1, wherein the gate electrode is made of poly-crystalline silicon.

14. A field controlled semiconductor device of SiC, comprising;
   a drain;
   a substrate arranged on said drain;
   a n-type drift layer arranged on said substrate;
   a p-type base layer arranged on said drift layer;
   a trench formed through said p-type base layer and extending into said drift layer;
   a n-type channel region extending at least vertically along a wall of said trench and being adjacent to said p-type base layer;
   a source region connected to said drift layer by said channel region; and
   a gate electrode arranged in said trench at least along said wall such that said p-type base layer is at an opposite side of said channel region, whereby a vertical conducting channel is formed in said channel region at a distance from said trench wall.

* * * * *

UNITED STATES PATENT AND TRADEMARK OFFICE
CERTIFICATE OF CORRECTION

PATENT NO. :   5,773,849
DATED      :   June 30, 1998
INVENTOR(S):   HARRIS et al.

It is certified that error appears in the above-identified patent and that said Letters Patent is hereby corrected as shown below:

Title page, item [54] and Column 1, line 1;
       change "FIELD OF THE INVENTION" to
-- FIELD CONTROLLED SEMICONDUCTOR DEVICE OF SIC AND A METHOD FOR PRODUCTION THEREOF--

Signed and Sealed this

Twentieth Day of October, 1998

Attest:

BRUCE LEHMAN

*Attesting Officer*      *Commissioner of Patents and Trademarks*